(12) United States Patent
Xu et al.

(10) Patent No.: US 9,900,025 B2
(45) Date of Patent: Feb. 20, 2018

(54) EFFICIENT ADAPTIVE SEISMIC DATA FLOW LOSSLESS COMPRESSION AND DECOMPRESSION METHOD

(71) Applicant: INSTITUTE OF GEOLOGY AND GEOPHYSICS, CHINESE ACADEMY OF SCIENCES, Beijing (CN)

(72) Inventors: Shanhui Xu, Beijing (CN); Jian Guo, Beijing (CN); Changchun Yang, Beijing (CN); Guangding Liu, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/523,449

(22) PCT Filed: Oct. 9, 2015

(86) PCT No.: PCT/CN2015/000680
§ 371 (c)(1),
(2) Date: May 1, 2017

(87) PCT Pub. No.: WO2016/065732
PCT Pub. Date: May 6, 2016

(65) Prior Publication Data
US 2017/0317688 A1    Nov. 2, 2017

(30) Foreign Application Priority Data

Oct. 29, 2014  (CN) .......................... 2014 1 0591173

(51) Int. Cl.
*H03M 7/34* (2006.01)
*H03M 7/30* (2006.01)
(Continued)

(52) U.S. Cl.
CPC ............... *H03M 7/30* (2013.01); *H03M 7/70* (2013.01); *G01V 1/28* (2013.01); *G01V 11/00* (2013.01); *H04B 1/66* (2013.01)

(58) Field of Classification Search
CPC .. H03M 7/30; H04N 7/50; H04B 1/66; G01V 1/28; G01V 11/00
(Continued)

(56) References Cited

U.S. PATENT DOCUMENTS 5,757,852 A  *  5/1998  Jericevic ............. H03M 7/3013
                                                    348/384.1
6,021,378 A     2/2000  Reiter et al.

FOREIGN PATENT DOCUMENTS

| CN | 103197343 A | 7/2013 |
| CN | 103792570 A | 5/2014 |
| CN | 104378118 A | 2/2015 |

OTHER PUBLICATIONS

Hongzhi Sun. Research of a 24 Bit Real Time Seismological Data Compression Method. Seismological Research of Northeast China, vol. 21, No. 2, Jun. 30, 2005, ISSN: 1674-8565, p. 57-61.
(Continued)

*Primary Examiner* — Joseph Lauture
(74) *Attorney, Agent, or Firm* — Gokalp Bayramoglu

(57) ABSTRACT

An efficient adaptive seismic data flow lossless compression and decompression method, which aims at solving the problem that data occupies the storage space and affects the transmission efficiency and is used for efficiently compressing geophysical instrument data, particularly seismic data after 24-bit analog-to-digital conversion. In the method, a data flow is compressed in a lossless mode in real time, and sampling data is adaptively compressed into 1 byte or 2 bytes or 3 bytes from original 24 bits and 3 bytes in a coding manner. Besides the foregoing data ranges, other integers that can be expressed by other 24-bit integer data with
(Continued)

symbols are required to be expressed by 4 bytes after being operated through a compression algorithm. The method has the advantages of saving a large amount of storage space and remarkably increasing the data transmission efficiency.

10 Claims, 2 Drawing Sheets

(51) Int. Cl.
  *G01V 11/00*   (2006.01)
  *G01V 1/28*   (2006.01)
  *H04B 1/66*   (2006.01)

(58) Field of Classification Search
  USPC ............ 341/51, 50; 375/240, 241; 702/14, 6
  See application file for complete search history.

(56) References Cited

OTHER PUBLICATIONS

Yi Sun et al. Lossless Compression of Seismic Data. Computer Technology and Development, vol. 21, No. 8. Aug. 31, 2011, ISSN: 1673-629X, pp. 177-180.

Zhihui Li. Algorithm of Lossless Data Compression and Restoration. Microcomputer Applications, vol. 21, No. 2, Mar. 1, 2000, ISSN: 2095-347X, p. 97.

* cited by examiner

EFFICIENT ADAPTIVE SEISMIC DATA FLOW LOSSLESS COMPRESSION AND DECOMPRESSION METHOD

CROSS REFERENCE TO RELATED APPLICATIONS

This application is the national phase entry of International Application No. PCT/CN2015/000680, filed on Oct. 9, 2015, which is based upon and claims priority to Chinese Patent Application No. 201410591173.5 (CN), filed on Oct. 29, 2014, the entire contents of which are incorporated herein by reference.

TECHNICAL FIELD

The invention relates to a seismic data process method, in particular to an efficient adaptive seismic data lossless compression and decompression Method.

BACKGROUND 24-bit AD conversion technology is currently the most commonly used analog-to-digital conversion technology in geophysical exploration equipment, especially seismic exploration equipment. The sampled data in this study are 3-byte signed integer data after 24-bit analog-to-digital conversion. In general, the higher the AD conversion bit number, the greater the data acquisition dynamic range is, but this comes with an increases in the amount of data. In recent years, due to a large increase in the number of acquisition channels in seismic data storage and data transmission processes of distributed geophysical instruments (especially for seismic instruments), there has been a high demand to ensure high acquisition precision and improved data transmission efficiency to reduce storage space. The existing seismic data compression algorithms can be divided into 2 types: loss compression and lossless compression. Lossless compression typically uses the general computer data compression method, which employs statistical data redundancy to compress data. Additionally, lossless compression requires a certain amount of data in order to operate after data acquisition. Lossless compression is not used in real-time transmission of data flow. The loss compression algorithm for seismic data typically relies on the Fourier transform, the wavelet transform, or other mathematical methods to transform the seismic data from the time domain to other domains in order to reduce the amount of data. Loss compression methods require complex calculations, and are hindered by the fact that inverse decompression cannot achieve complete restoration of the original data. Moreover, loss compression methods require complete seismic data to operate, and such methods cannot function using small data samples. Finally loss compression methods cannot compress data streams in real-time.

In the acquisition of seismic data (except for a small amount of near-offset data and data within a short time after source excitation), the majority of data values are small, and the use of 8 or 16 bits provide a complete representation of the data. Specifically, 3 bytes of signed integer data can be used to represent each data sampling point, resulting in a waste of storage space. As such, there is a need to compress the data. Based on the size of the seismic data, 3 bytes can be compressed to 1 or 2 bytes. The difficulty of utilizing the lossless compression technique is finding a reasonable way to encode the data, so that when decompressing the data (based on the encoding rules that determine the number of bytes occupied by each data sampling point), through a reasonable way of decoding, the original data is completely restored.

SUMMARY OF THE INVENTION

The invention is a highly efficient lossless compression and decompression method that can be applied to mass geophysical acquisition data, especially seismic data. The method allows for real-time lossless compression of 24-bit analog-to-digital (AD) conversion data in the acquisition of geophysical equipment, especially seismic equipment, which improves equipment storage capacity and transmission efficiency. The method serves as a type of data encoding and decoding technology for use in geophysical prospecting equipment, especially in terms of communication processes and data transmission in seismic exploration equipment.

To achieve the purpose above, the method functions as an efficient adaptive seismic data stream lossless compression method for efficient compression of 24-bit analog-to-digital converted geophysical prospecting equipment data, particularly seismic data. It is characterized by real-time lossless compression of data streams, and compresses the original 24-bit 3-byte format of sampled data to a 1, 2, or 3-byte format (a small amount of data is converted to 4 bytes) using a specific encoding process. Compression greatly reduces the amount of data, improves data transmission efficiency, and increases storage space.

Before data compression, the required bytes are determined based on the size of the original data. Data in the [0-63] and [−64−−1] intervals are 1 byte post-compression. Data in the [64-8191] and [−8192−−65] intervals are 2 bytes post-compression. Data in the [8192 to 104875] and [−104876−−8193] intervals are 3 bytes post-compression. The occupying bytes are the same as the original bytes. In addition to the above data ranges, other integer numbers can be represented by other 24-bit signed integer data; however, these integers require 4 bytes after the compression algorithm operation.

In data compression, there are a required number of bytes and positive or negative values needed to select different operators and operation codes (opcodes) for the bit operation on specified bytes. The opcode is a binary number of the byte. There are 2 types of operators: (1) bitwise AND (&) and (2) bitwise OR (|). The byte lower than the specified byte position does not need to be processed. The byte higher than the specified byte position is invalid and can be deleted directly. See Table 1 for operators and opcodes selected by first byte operations under different conditions.

Compression greatly reduces the amount of data, improves data transmission efficiency and increases storage space. Seismic data collected using the dynamite seismic source or the controllable seismic source can be compressed to 60-80% of the original data size (differentiated based on the pre-amplifier gain). In seismic data acquisition without strong vibration energy, such as microseismic monitoring, data compression energy can reach 40-50%, and 33% in the best cases. It has the advantages of real-time lossless compression of 24-bit analog-to-digital conversion data in the geophysical equipment, especially seismic equipment, in order to improve the storage capacity and transmission efficiency of the equipment.

In aspect of optimizing, the compression operation is a cyclical operation performed on 3 bytes of each data sampling point: After a byte is read, a numerical judgment is made, and then divide the byte into 8 compression modes for processing based on the numerical size and the positive or negative value of the byte, the core of the compression operation does not change the bit in terms of the magnitude of the values, and redundant sign bits are deleted. Moreover, add different flag bits identify the number of data bytes. For example, "00" on behalf of the data compressed into 1 positive byte, "10" on behalf of the data compressed into 1 negative byte, "010" on behalf of the data compressed into 2 positive bytes, and so on.

In one aspect of optimizing, the 8 operation modes are as follows:

1. The [000000h, 00003Fh] interval data use the end byte as the compression result in order to achieve compression in the range of 1-3 bytes. Because the first 2 bytes of data within the interval are both 000h, the first 2 bits of end byte are 00.

2. The [FFFFC0h, FFFFFFh] interval data use the end byte and the BFh for the bitwise AND operation as the compression result. The end byte changes from 11bbbbbb to 10bbbbbb in order to achieve compression in the 1 byte range.

3. The [000040h, 001FFFh] interval data use the middle byte and the 40h for the bitwise OR operation. Then, the result of the operation and the end byte are used as the compression result; the middle byte changes from 000bbbbb to 010bbbbb in order to achieve compression in the 2 bytes range.

4. The [FFE000h, FFFFBFh] interval data use the middle byte and the DFh for the bitwise AND operation. Then, the result of the operation and the end byte are used as the compression result; the middle byte changes from 111bbbbb to 110bbbbb in order to achieve compression in the 2 bytes range.

5. The [002000h, 0FFFFFh] interval data use the first byte and the 60h for the bitwise OR operation. Then, the result of the operation, the middle byte, and the end byte are used together as the compression result; the first byte changes from 0000bbbb to 0110bbbb, the middle byte and end byte remain unchanged, and the data occupies 3 bytes both before and after compression.

6. The [F00000h, FFDFFFh] interval data use the first byte and the EFh for the bitwise AND operation. Then, the result of the operation, the middle byte, and the end byte are used together as the compression result; the first byte changes from 1110bbbb to 1111bbbb, the middle byte and end byte remain unchanged, and the data occupies 3 bytes both before and after compression.

7. The [100000h, 7FFFFFh] interval data ensure the original 3 bytes do not move, and then adds 70h as the first byte. The newly formed 4 bytes function as the compression operation result.

8. The [800000h, EFFFFFh] interval data ensure the original 3 bytes do not move, and then adds F0h as the first byte. The newly formed 4 bytes function as the compression operation result.

Modes 7 and 8 actually increase the number of occupied bytes from 3 bytes in the original data to 4 bytes after compression, because in modes 6 and 7, 3 bits in addition to the sign bit are required for the flag bits, i.e., in "0110" and "1110," the range of positive and negative data that can be expressed is reduced from 23-bit 0 (1) bbbbbbb bbbbbbbb bbbbbbbb to 20-bit 0 (1) 110bbbb bbbbbbbb bbbbbbbb. Moreover, valid data occupying the range between 20 and 23 bits cannot be represented by 3 bytes. In addition, it should be noted that the added first bytes "7011" and "F0h" in modes with 4 bytes are not unusual, because the flag bit requires 4 bytes of compressed data in order to use judgment codes "01110" or "11110." Specifically, the first byte can be represented by any number between 01110bbb and 1110bbb, and any number in this range used as the first byte does not affect the decompression byte number judgment and decompression result.

In the case of seismic data, under normal circumstances, the number of cases that meet the conditions of modes 1, 2, 3, and 4 is much larger than the number of cases that meet the conditions of modes 5-8. Modes 7 and 8 rarely occur, and therefore have a very good data compression effect as a whole.

In aspect of optimizing, data compression is independently operated on each data sample, and does not rely on other sample data. As such, the data stream can be compressed in real-time.

In aspect of optimizing, the efficient adaptive seismic data stream lossless decompression method operates on binary data compressed using the inventive compression method. As such, the number of bytes occupied is firstly had to determine by each data sampling point in accordance with the compression coding rule. Then, via a set decoding operations, lossless seismic data compressed can be restored as 1, 2, or 3 bytes (a very small number can only be compressed to 4 bytes) to the original 24-bit 3-byte data format at any time.

The basic process of lossless decompression is: (1) a byte is selected using the mask determination method to judge the number of bytes (1, 2, 3, or 4). The selected byte functions as a data sample from this byte. (2) the byte is recovered. Specifically a number of bytes are intercepted as determined in Step 1, and then the bit operation is performed on the first byte in order to recover the valid bytes. See the manual for operator and opcode details. The remaining bytes are left intact. (3) sign bit expansion is performed. Specifically, a byte that does not affect the value is added and the symbol are only represented for the sampled data (at less than 3 bytes). then all the sampled data are restored to the 3-byte 24-bit format.

In aspect of optimizing, beginning with the first byte of the compressed file or data stream, the byte is masked and used it with the F0h for the bitwise AND operation. The subsequent value can be divided into 8 different modes based on the operation result.

In aspect of optimizing, the 8 different modes are as follows:

1. If the operation result is a value of 00h, 10h, 20h, or 30h, it means that 1 byte from the original byte (including the original byte) is a positive data sampling point that can be taken as an end byte. Then, by adding 00h as the middle byte and 00h as the first byte, there are 3 bytes that function as the decompression result (which is the same value as the value before compression).

2. If the operation result is a value of 80h, 90h, A0h, or B0h, it means that 1 byte from the original byte (including the original byte) is a negative data sampling point. By using the original byte and the C0h for the bitwise OR operation, you can use the result as an end byte. By adding FFh as the middle byte and FFh as the first byte, there are 3 bytes that function as the decompression result (which is the same value as the value before compression).

3. If the operation result is a value of 50h or 40h, it means that 2 bytes from the original byte (including the original byte) are a positive data sampling point. By using the original byte and 1Fh for the bitwise AND operation, you can use the result as the end byte. The next byte of the original byte is the middle byte. By adding 00h as the first byte, there are 3 bytes that function as the decompression result (which is the same value as the value before compression).

4. If the operation result is a value of D0h or C0h, it means that 2 bytes from the original byte (including the original byte) are a negative data sampling point. By using the original byte and E0h for the bitwise OR operation, you can use the result as the end byte. The next byte of the original byte is the middle byte. By adding FFh as the first byte, there are 3 bytes that function as the decompression result (which is the same value as the value before compression).

5. If the operation result is 60h, it means that 3 bytes from the original byte (including the original byte) are a positive data sampling point. By using the original byte and 0Fh for the bitwise AND operation, you can use the results as the end byte. The next 2 bytes of the original byte are the middle byte and first byte. These 3 bytes are the decompression result (which is the same value as the value before compression).

6. If the operation result is EFh, it means that 3 bytes from the original byte (including the original byte) are a negative data sampling point. By using the original byte and E0h for the bitwise OR operation, you can use the result as the end byte. The next 2 bytes of the original byte are the middle byte and first byte. These 3 bytes are the decompression result (which is the same value as the value before compression).

7. If the operation result is 70h, it means that 4 bytes from the original byte (including the original byte) are a positive data sampling point. The current byte is not needed, and the next 3 bytes from the current byte are the original data.

8. If the operation result is F0h, it means that 4 bytes from the original byte (including the original byte) are a negative data sampling point. The current byte is not needed, and the next 3 bytes from the current byte are the original data.

After decompressing a data sample using any of the above 8 modes, it is necessary to jump the pointer to the corresponding byte to perform the next sampled data judgment and decompression operation. Specifically it is necessary to jump 1 byte after the operation of modes 1 and 2; 2 bytes after the operation of modes 3 and 4; 3 bytes after the operation of modes 5 and 6; and 4 bytes after the operation of modes 7 and 8

In aspect of optimizing, the method can also be applied to 24-bit sampled seismic data files stored in binary form, after the file is processed using the compression algorithm (thereby significantly reducing the file bytes), the file can be fully restored to its original form by using the decompression algorithm, and for the ordinary integer 4-byte 32-bit signed integer storage of seismic data files, it is a sign bit expansion on the basis of the 24-bit integer, adding a Symbol byte of 00h or FFh which does not affect the value, for four bytes corresponding to each sample, the symbol byte can be ignored and threw away, you can directly do the compression operation on the remaining three bytes; decompression can be carried out using the method firstly and then performs the sign bit expansion and restores it into the original 4-byte integer data file. Similar operations can be performed on the 4-byte integer seismic data stream for compression and decompression operations.

In aspect of optimizing, the basic process of the efficient adaptive seismic data lossless compression and decompression method used in seismic acquisition system is: acquiring the station analog-digital conversion module output 24-bit integer data; performing the master cpu or FPGA module compression operation; after compression, transferring the data via the network to the power station or crossover stationmaster module or FPGA module and perform the decompression operation based on the decompression algorithm to restore the 24-bit integer data. The compressed data can also be decompressed after the seismometer host system accepts it, alternatively, the compressed data can be directly stored in a file, and then decompressed to restore the original data.

With the above technical scheme, it has the advantages of real-time lossless compression of 24-bit analog-to-digital conversion data in the geophysical equipment, especially seismic equipment, in order to improve the storage capacity and transmission efficiency of the equipment.

DETAILED DESCRIPTION OF THE INVENTION

Figure 1:
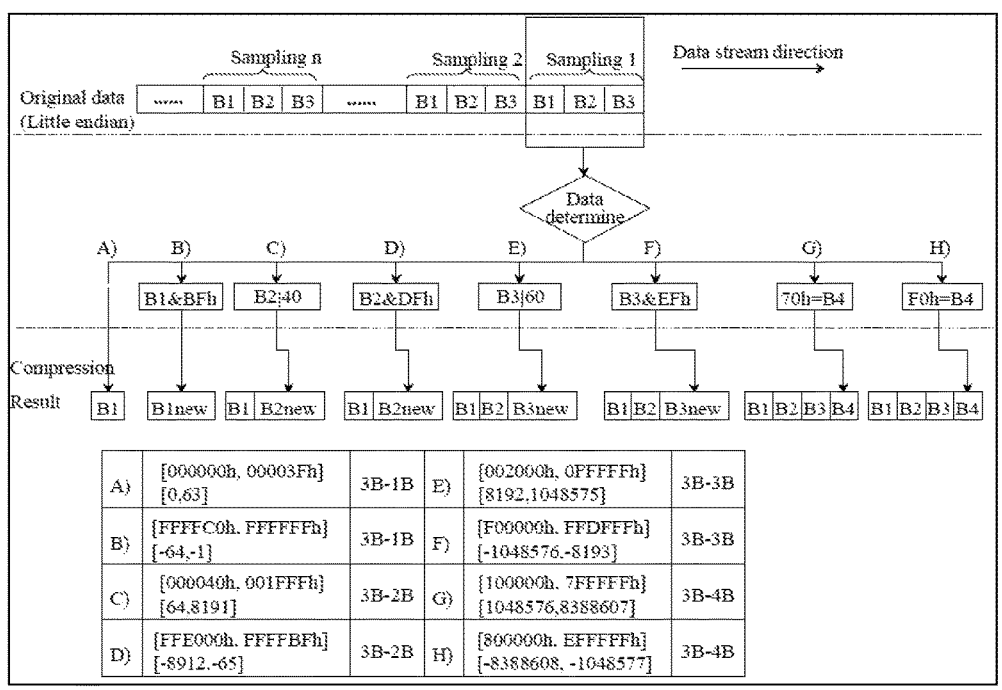
FIG. 1 shows the flow chart of the efficient adaptive seismic data stream lossless compression method.

FIG. 1 shows the process of lossless compression. As shown in FIG. 1, the compression operation is a cyclical operation performed on 3 bytes of each data sampling point. After a byte is read, a numerical judgment is made, and then divide the byte into 8 compression modes for processing based on the numerical size and the positive or negative value of the byte. Table 1 and FIG. 1 show 8 modes corresponding to the original data range. In each mode, the original 3-byte data was converted to 1, 2, 3, or 4 bytes after compression. Table 1 also lists the compressed data in its binary form, where "b" represents that the bit is either 0 or 1. From the compressed binary form of the value, it can be seen that the core of the compression operation does not change the bit in terms of the magnitude of the values, and redundant sign bits are deleted. Moreover, add different flag bits identify the number of data bytes. For example, "00" on behalf of the data compressed into 1 positive byte, "10" on behalf of the data compressed into 1 negative byte, "010" on behalf of the data compressed into 2 positive bytes, and so on. 8 modes of operation are described in detail as below.

① The [000000h, 00003Fh] interval data use the end byte as the compression result in order to achieve compression in the range of 1-3 bytes. Because the first 2 bytes of data within the interval are both 00h, the first 2 bits of end byte are 00.

②. The [FFFFC0h, FFFFFFh] interval data use the end byte and the BFh for the bitwise AND operation as the compression result. The end byte changes from 11bbbbbb to 10bbbbbb in order to achieve compression in the 1 byte range.

③ The [000040h, 001FFFh] interval data use the middle byte and the 40h for the bitwise OR operation. Then, the result of the operation and the end byte are used as the compression result; the middle byte changes from 000bbbbb to 010bbbbb in order to achieve compression in the 2 bytes range.

④ The [FFE000h, FFFFBFh] interval data use the middle byte and the DFh for the bitwise AND operation. Then, the result of the operation and the end byte are used as the compression result; the middle byte changes from 111bbbbb to 110bbbbb in order to achieve compression in the 2 bytes range.

⑤ The [002000h, 0FFFFFh] interval data use the first byte and the 60h for the bitwise OR operation. Then, the result of the operation, the middle byte, and the end byte are used together as the compression result; the first byte changes from 0000bbbb to 0110bbbb, the middle byte and end byte remain unchanged, and the data occupies 3 bytes both before and after compression.

⑥ The [F00000h, FFDFFFh] interval data use the first byte and the EFh for the bitwise AND operation. Then, the result of the operation, the middle byte, and the end byte are used together as the compression result; the first byte changes from 1110bbbb to 1111bbbb, the middle byte and end byte remain unchanged, and the data occupies 3 bytes both before and after compression.

⑦ The [100000h, 7FFFFFh] interval data ensure the original 3 bytes do not move, and then adds 70h as the first byte. The newly formed 4 bytes function as the compression operation result.

⑧ The [800000h, EFFFFFh] interval data ensure the original 3 bytes do not move, and then adds F0h as the first byte. The newly formed 4 bytes function as the compression operation result.

Modes 7 and 8 actually increase the number of occupied bytes from 3 bytes in the original data to 4 bytes after compression, because in modes 6 and 7, 3 bits in addition to the sign bit are required for the flag bits, i.e., in "0110" and "1110," the range of positive and negative data that can be expressed is reduced from 23-bit 0 (1) bbbbbbb bbbbbbbb bbbbbbbb to 20-bit 0 (1) 110bbbb bbbbbbbb bbbbbbbb. Moreover, valid data occupying the range between 20 and 23 bits cannot be represented by 3 bytes. In addition, it should be noted that the added first bytes "70h" and "F0h" in modes with 4 bytes are not unusual, because the flag bit requires 4 bytes of compressed data in order to use judgment codes "01110" or "11110." Specifically, the first byte can be represented by any number between 01110bbb and 11110bbb, and any number in this range used as the first byte does not affect the decompression byte number judgment and decompression result.

In the case of seismic data, under normal circumstances, the number of cases that meet the conditions of modes 1, 2, 3, and 4 is much larger than the number of cases that meet the conditions of modes 5-8. Modes 7 and 8 rarely occur, and therefore have a very good data compression effect as a whole.

Figure 2:
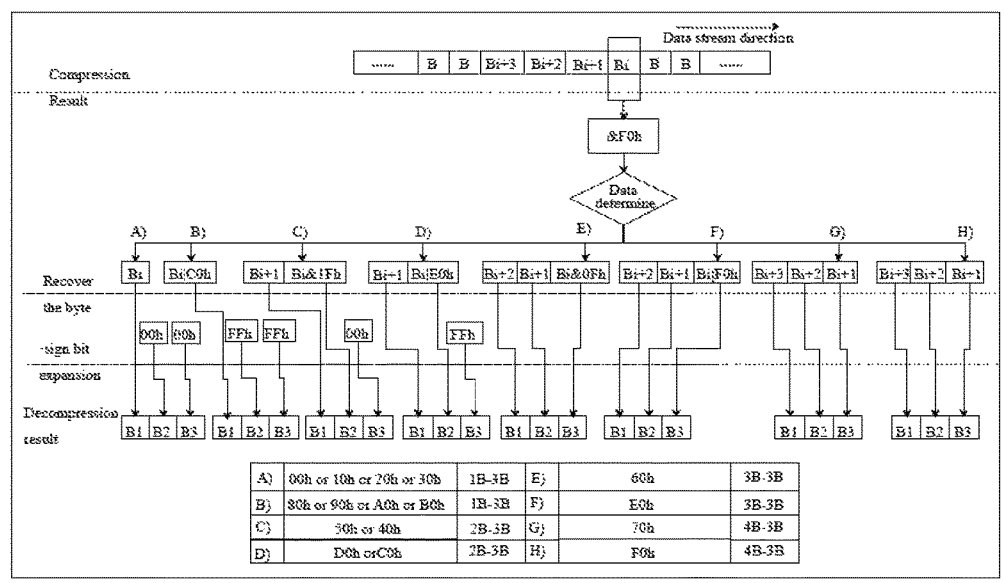
FIG. 2 shows flow chart of the efficient adaptive seismic data stream lossless decompression method.

FIG. 2 shows the basic process of data decompression. The first step of the decompression operation is to determine the number of bytes occupied by the data sampling point. Specifically, how many bytes would be occupied should be determined after data compression before restoring each data sampling point to its original form. Beginning with the first byte of the compressed file or data stream, the byte is masked and used it with the F0h for the bitwise AND operation. The subsequent value can be divided into 8 different modes based on the operation result. The details are as follows:

①. If the operation result is a value of 00h, 10h, 20h, or 30h, it means that 1 byte from the original byte (including the original byte) is a positive data sampling point that can be taken as an end byte. Then, by adding 00h as the middle byte and 00h as the first byte, there are 3 bytes that function as the decompression result (which is the same value as the value before compression).

② If the operation result is a value of 80h, 90h, A0h, or B0h, it means that 1 byte from the original byte (including the original byte) is a negative data sampling point. By using the original byte and C0h for the bitwise OR operation, you can use the result as an end byte. By adding FFh as the middle byte and FFh as the first byte, there are 3 bytes that function as the decompression result (which is the same value as the value before compression).

③ If the operation result is a value of 50h or 40h, it means that 2 bytes from the original byte (including the original byte) are a positive data sampling point. By using the original byte and 1Fh for the bitwise AND operation, you can use the result as the end byte. The next byte of the original byte is the middle byte. By adding 00h as the first byte, there are 3 bytes that function as the decompression result (which is the same value as the value before compression).

④ If the operation result is a value of D0h or C0h. it means that 2 bytes from the original byte (including the original byte) are a negative data sampling point. By using the original byte and E0h for the bitwise OR operation, you can use the result as the end byte. The next byte of the original byte is the middle byte. By adding FFh as the first byte, there are 3 bytes that function as the decompression result (which is the same value as the value before compression).

⑤ If the operation result is 60h. it means that 3 bytes from the original byte (including the original byte) are a positive data sampling point. By using the original byte and 0Fh for the bitwise AND operation, you can use the results as the end byte. The next 2 bytes of the original byte are the middle byte and first byte. These 3 bytes are the decompression result (which is the same value as the value before compression).

⑥ If the operation result is EFh, it means that 3 bytes from the original byte (including the original byte) are a negative data sampling point. By using the original byte and E0h for the bitwise OR operation, you can use the result as the end byte. The next 2 bytes of the original byte are the middle byte and first byte. These 3 bytes are the decompression result (which is the same value as the value before compression).

⑦ If the operation result is 70h, it means that 4 bytes from the original byte (including the original byte) are a positive data sampling point. The current byte is not needed, and the next 3 bytes from the current byte are the original data.

⑧ If the operation result is F0h, it means that 4 bytes from the original byte (including the original byte) are a negative data sampling point. The current byte is not needed, and the next 3 bytes from the current byte are the original data.

After decompressing a data sample using any of the above 8 modes, it is necessary to jump the pointer to the corresponding byte to perform the next sampled data judgment and decompression operation. Specifically, it is necessary to jump 1 byte after the operation of modes 1 and 2; 2 bytes after the operation of modes 3 and 4; 3 bytes after the operation of modes 5 and 6; and 4 bytes after the operation of modes 7 and 8.

TABLE 1

Operators and opcode table required for efficient adaptive seismic data flow lossless compression and decompression method

| Interval of numbers before compression | Number of bytes required after compression | Binary form of the compressed value | Compression Operator | Compression Opcode | Occcupied bytes determination Use mask judgment (& F0h) | Decompression Valid byte correction* | Decompression Sign bit expansion |
|---|---|---|---|---|---|---|---|
| [000000h, 00003Fh] [0, 63] | 1 | 00bbbbbb | | | 00h or 10h or 20h or 30h | | Add 2 bytes 0000h |
| [FFFFC0h, FFFFFFh] [−64, −1] | | 10bbbbbb | End byte & | BFh | 80h or 90h or A0h or B0h | \| C0h | Add 2 bytes FFFFh |
| [000040h, 001FFFh] [64, 8191] | 2 | 010bbbbb bbbbbbbb | Middle byte \| | 40h | 50h or 40h | & 1Fh | Add 00h as the first byte |
| [FFE000h, FFFFBFh] [−8192, −65] | | 110bbbbb bbbbbbbb | Middle byte & | DFh | D0h or C0h | \| E0h | Add FFh as the first byte |
| [002000h, 0FFFFFh] [8192, 1048575] | 3 | 0110bbbb bbbbbbbb bbbbbbbb | First byte \| | 60h | 60h | & 0Fh | |
| [F00000h, FFDFFFh] [−1048576, −8193] | | 1110bbbb bbbbbbbb bbbbbbbb | Firsst byte & | EFh | E0h | \| F0h | |
| [100000h, 7FFFFFh] [1048576, 8388607] | 4 | 01110000 bbbbbbbb bbbbbbbb bbbbbbbb | Add first byte | 70h | 70h | Delete the first byte | |
| [800000h, EFFFFFh] [−8388608, −1048577] | | 11110000 1bbbbbbb bbbbbbbb bbbbbbbb | Add first byte | F0h | F0h | | |

Note:
*Operation on compressed first byte

What is claimed is:

1. An efficient adaptive seismic data flow lossless compression and decompression method, applied to a data acquired in a geophysical equipment for efficient compression of 24-bit analog-to-digital data within the geophysical equipment, the method comprising:
  determining a size of bytes based on a size of an original data;
  compressing the data into one byte if the interval of numbers is between −64 and 63;
  compressing the data into two bytes if the interval of numbers is between −8192 and −65 or between 64 and 8191;
  compressing the data into three bytes if the interval of numbers is between 8192 and 104875 or between −104876 and −8192;
  compressing the data into four bytes if the data is 24-bit signed integer data that is outside the interval of numbers between −64 and 63 or outside the interval of numbers between −8192 and −65 or between 64 and 8191 or between 8192 and 104875 or between −104876 and −8192;
  wherein in the data compression there are a required number of bytes and positive or negative values are needed to select different operators and operation codes (opcodes) for a bit operation on a plurality of specified bytes;
  wherein the opcode is a binary number of the byte;
  wherein there are two types of operators: one is bitwise AND (&) and the other is bitwise OR (\|);
  setting a specified bit position;
  ignoring the bytes lower than the specified byte position and not processing said lower bytes;
  deleting bytes higher than the specified byte position as invalid; wherein operators and opcodes for a first byte are different under different conditions.

2. The method according to claim 1, wherein the compression algorithm operation is a cyclical operation performed on 3 bytes of each data sampling point; the method further comprising:
  reading a byte,
  determining a value of the byte;
  dividing the byte into 8 compression modes for processing based on numerical size and positive or negative value of the byte,
  leaving unchanged bits in terms of a magnitude of values using a core of the compression algorithm operation; and deleting redundant sign bits.

3. The method according to claim 2, wherein the compression has the following 8 compression modes:
  (1) if the data is between 000000h and 00003Fh use an end byte as a compression result in order to achieve compression in a range of 1-3 bytes; because first two bytes of the data within the interval are 00h, the first two bits of the end byte are 00;
  (2) if the data is between FFFFC0h and FFFFFFh use an end byte and a BFh for a bitwise AND operation as the compression result; the end byte changes from 11bbbbbb to 10bbbbbb in order to achieve compression in 1 byte range;
  (3) if the data is between 000040h and 001FFFh performing a bitwise OR operation on a middle byte and 40h; then, a result of the operation and the end byte are used as the compression result; the middle byte changes from 000bbbbb to 010bbbbb in order to achieve compression in 2 bytes range;

(4) if the data is between FFE000h and FFFFBFh use a middle byte and a DFh for the bitwise AND operation; then, a result of the operation and the end byte are used as the compression result; the middle byte changes from 111bbbbb to 110bbbbb in order to achieve compression in 2 bytes range;

(5) if the data is between 002000h and 0FFFFFh use a first byte and the 60h for the bitwise OR operation; then, a result of the operation, a middle byte, and an end byte are used together as the compression result; the first byte changes from 0000bbbb to 0110bbbb, the middle byte and end byte remain unchanged, and data occupies 3 bytes both before and after compression;

(6) if the data is between F00000h and FFDFFFh use a first byte and a EFh for the bitwise AND operation; then, a result of the operation, a middle byte, and an end byte are used together as the compression result; the first byte changes from 1110bbbb to 1111bbbb, the middle byte and end byte remain unchanged, and data occupies 3 bytes both before and after compression;

(7) if the data is between 100000h and 7FFFFFh ensure original 3 bytes do not move, and then adds 70h as a first byte; newly formed 4 bytes function as the compression operation result;

(8) if the data is between 800000h and EFFFFFh ensure the original 3 bytes do not move, and then adds F0h as the first byte; newly formed 4 bytes function as the compression operation result.

4. The method according to claim 3, wherein modes 7 and 8 increase a number of bytes from 3 bytes in the original data to 4 bytes after the compression;
wherein in modes 6 and 7, 3 bits in addition to a sign bit are required for flag bits in "0110" and "1110," range of positive and negative data expressed is reduced from 23-bit 0 (1) bbbbbbb bbbbbbbb bbbbbbbb to 20-bit 0 (1) 110bbbb bbbbbbbb bbbbbbbb; wherein valid data occupying a range between 20 and 23 bits is not represented by 3 bytes; in addition, added first bytes "70h" and "F0h" in modes with 4 bytes are not unusual; wherein the flag bit requires 4 bytes of compressed data in order to use judgment codes "01110" or "11110", specifically, the first byte is represented by any number between 01110bbb and 11110bbb, and decompression byte number judgment and decompression result are not affected by any number in range between 01110bbb and 11110bbb used as the first byte.

5. The method according to claim 1, wherein the data compression is independently operated on each data sample, not relying on other sample data, and the data stream is compressed in real-time.

6. The method according to claim 1, further comprising: decompressing the compressed data;
wherein when decompression operations are conducted on binary data compressed using the compression method, the number of bytes occupied are firstly determined by each data sampling point in accordance with a compression coding rule;
wherein, via a series of set decoding operations, lossless seismic compressed data are restored as 1, 2, 3, or 4 bytes to the original 24-bit 3-byte data format at any time;
wherein the step of decompressing the compressed data comprises the following sub-steps:
(1) selecting a byte using a mask determination method to determine a number of bytes in a sample data; wherein the selected byte functions as a beginning byte;

(2) recovering the byte; cutting out the data with the number of bytes as determined in Step 1, and performing the bit operation on the first byte in order to recover valid bytes; and remaining bytes are left intact;

(3) performing sign bit expansion; wherein a byte that does not affect the value is added, and only represents a symbol for the sampled data (at less than 3 bytes);

(4) restoring the sampled data to a 3-byte 24-bit format.

7. The method according to claim 6, wherein beginning with the first byte of the compressed file or data stream, the byte is masked, using the byte with the F0h for the bitwise AND operation, wherein subsequent values are divided into 8 different modes based on the operation result.

8. The method according to claim 6, wherein 8 different modes are as follows:
if an operation result is a value of 00h, 10h, 20h, or 30h, the operation result means that 1 byte from the original byte (including the original byte) is a positive data sampling point that is taken as an end byte, then, by adding 00h as a middle byte and 00h as a first byte, there are 3 bytes that function as a decompression result (which is a same value as a value before compression);
if the operation result is a value of 80h, 90h, A0h, or B0h, the operation result means that 1 byte from the original byte (including the original byte) is a negative data sampling point, by using the original byte and the C0h for a bitwise OR operation, the result is used as an end byte, by adding FFh as the middle byte and FFh as the first byte, there are 3 bytes that function as the decompression result (which is the same value as the value before compression);
if the operation result is a value of 50h or 40h, the operation result means that 2 bytes from the original byte (including the original byte) are a positive data sampling point, by using the original byte and 1Fh for a bitwise AND operation, the result is used as the end byte, a next byte of the original byte is the middle byte, by adding 00h as the first byte, there are 3 bytes that function as the decompression result (which is the same value as the value before compression);
if the operation result is a value of D0h or C0h, the operation result means that 2 bytes from the original byte (including the original byte) are a negative data sampling point, by using the original byte and E0h for the bitwise OR operation, the result is used as the end byte, the next byte of the original byte is the middle byte, by adding FFh as the first byte, there are 3 bytes that function as the decompression result (which is the same value as the value before compression);
if the operation result is 60h, the operation result means that 3 bytes from the original byte (including the original byte) are a positive data sampling point, by using the original byte and 0Fh for the bitwise AND operation, the results are used as the end byte, a next 2 bytes of the original byte are the middle byte and first byte, these 3 bytes are the decompression result (which is the same value as the value before compression);
if the operation result is EFh, the operation result means that 3 bytes from the original byte (including the original byte) are a negative data sampling point, by using the original byte and E0h for the bitwise OR operation, the result is used as the end byte, the next 2 bytes of the original byte are the middle byte and first byte, these 3 bytes are the decompression result (which is the same value as the value before compression);
if the operation result is 70h, the operation result means that 4 bytes from the original byte (including the original byte) are a positive data sampling point, a current byte is not needed, and a next 3 bytes from the current byte are the original data;

if the operation result is F0h, the operation result means that 4 bytes from the original byte (including the original byte) are a negative data sampling point, the current byte is not needed, and the next 3 bytes from the current byte are the original data;

wherein after decompressing a data sample using any of the above 8 modes, it is necessary to jump a pointer to a corresponding byte to perform the next sampled data judgment and the decompression operation, wherein the decompression operation jumps 1 byte after the operation of modes 1 and 2:2 bytes after the operation of modes 3 and 4; 3 bytes after the operation of modes 5 and 6; and 4 bytes after the operation of modes 7 and 8.

9. The method according to claim 1, wherein the method is applied to 24-bit sampled seismic data files stored in binary form, after the seismic data files are processed using the compression algorithm operation (thereby significantly reducing file bytes), wherein the files are fully restored to original form by using a decompression algorithm, and for an ordinary integer 4-byte 32-bit signed integer storage of seismic data files, the ordinary integer 4-byte 32-bit signed integer storage of seismic data files are a sign bit expansion on a basis of a 24-bit integer, adding a symbol byte of 00h or FFh which does not affect the values, for four bytes corresponding to each sample, the symbol byte is ignored and thrown away, the compression algorithm operation is conducted on remaining three bytes; decompression is carried out using the method firstly and then performs the sign bit expansion and restores it into the original 4-byte integer data file; similar operations are performed on the 4-byte integer seismic data stream for compression and decompression operations.

10. The method according to claim 1, wherein the process of the efficient adaptive seismic data lossless compression and decompression method used in seismic acquisition system further comprises:

acquiring a station analog-digital conversion module output 24-bit integer data; performing a master cpu or FPGA module compression operation;

transferring data via network to a power station or crossover stationmaster module or FPGA module after compression, and performing a decompression operation based on a decompression algorithm to restore the 24-bit integer data;

decompressing compressed data after a seismometer host system accepts it, alternatively, directly storing the compressed data in a file, and then decompressed to restore the original data.

* * * * *